(12) United States Patent
Kyung et al.

(10) Patent No.: US 8,704,647 B2
(45) Date of Patent: Apr. 22, 2014

(54) HAPTIC FEEDBACK CASE FOR ELECTRONIC EQUIPMENT

(75) Inventors: Ki-Uk Kyung, Daejeon (KR); Jeong Mook Lim, Daejeon (KR); Hyungon Kim, Gyeonggi-do (KR); Hee Sook Shin, Daejeon (KR); Yo-An Lim, Gwangju (KR); Jun Seok Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 132 days.

(21) Appl. No.: 13/332,983

(22) Filed: Dec. 21, 2011

(65) Prior Publication Data

US 2012/0154133 A1 Jun. 21, 2012

(30) Foreign Application Priority Data

Dec. 21, 2010 (KR) ........................ 10-2010-0131872

(51) Int. Cl.
*H04B 3/36* (2006.01)
*G08B 6/00* (2006.01)
*H01L 41/22* (2013.01)
*G06F 3/01* (2006.01)

(52) U.S. Cl.
CPC ... *G08B 6/00* (2013.01); *H01L 41/22* (2013.01); *G06F 3/016* (2013.01)
USPC ........................................ 340/407.1; 310/311

(58) Field of Classification Search
CPC ........... G08B 6/00; H01L 41/22; G06F 3/016; G06F 1/1616

USPC ........ 340/407.1; 310/311, 800; 345/156, 157; 361/679.01; 715/702
See application file for complete search history.

(56) References Cited

U.S. PATENT DOCUMENTS

| | | | | |
|---|---|---|---|---|
| 7,196,688 | B2 * | 3/2007 | Schena | 345/156 |
| 7,755,607 | B2 * | 7/2010 | Poupyrev et al. | 345/156 |
| 7,808,488 | B2 * | 10/2010 | Martin et al. | 345/169 |
| 8,222,799 | B2 * | 7/2012 | Polyakov et al. | 310/365 |
| 2005/0002168 | A1 * | 1/2005 | Narhi et al. | 361/800 |
| 2011/0090626 | A1 * | 4/2011 | Hoellwarth et al. | 361/679.01 |
| 2012/0126959 | A1 * | 5/2012 | Zarrabi et al. | 340/407.1 |
| 2013/0154914 | A1 * | 6/2013 | Salo et al. | 345/156 |

FOREIGN PATENT DOCUMENTS

| | | |
|---|---|---|
| KR | 1020090020037 | 2/2009 |
| KR | 1020100036651 | 4/2010 |

* cited by examiner

*Primary Examiner* — John A Tweel, Jr.
(74) *Attorney, Agent, or Firm* — Nelson Mullins Riley & Scarborough LLP; Anthony A. Laurentano, Esq.; Dipti Ramnarain, Esq.

(57) ABSTRACT

Disclosed is a haptic feedback case for electronic equipment, including: a main body configured to accommodate the electronic equipment; a communication unit configured to receive haptic generation information from the electronic equipment; a filmy type actuator configured to generate haptic sensations; and a control unit configured to operate the film type actuator according to the haptic generation information input from the communication unit.

13 Claims, 2 Drawing Sheets

HAPTIC FEEDBACK CASE FOR ELECTRONIC EQUIPMENT

CROSS-REFERENCES TO RELATED APPLICATIONS

The present application claims priority under 35 U.S.C 119(a) to Korean Application No. 10-2010-0131872, filed on Dec. 21, 2010, and Korean Application No. 10-2011-0134116, filed on Dec. 14, 2011 in the Korean Intellectual Property Office, which is incorporated herein by reference in its entirety set forth in full.

BACKGROUND

Exemplary embodiments of the present invention relate to a haptic feedback case for electronic equipment, and more particularly, to a haptic feedback case for electronic equipment interworking with a haptic generator including a film type actuator to provide haptic sensation in the case for electronic equipment.

With the rapid development of communication technologies and manufacturing technologies in mobile handsets, memory capacity or performance of a display device has been more swiftly developed than before, such that portable terminals can implement various multimedia functions such as moving picture viewing, MP3 playing, Internet, or the like, in addition to wireless communication functions.

In addition, the portable terminals are installed with a variety of online Internet games or embedded games that can be enjoyed by users regardless of place. Therefore, the portable terminals have mainly used a 'touch screen' as an input device that can provide an input from applications without a separate keyboard.

The touch screen provides an interface that enables a user to input commands or information to a terminal by touching the icons displayed on a screen using fingers, a stylus, a pen, or the like.

Therefore, when a user wants to speak to a person over the portable terminal, he/she touches the corresponding icons displayed on the touch screen of the display unit using a stylus pen or fingers, to press a telephone number key, a call key, or the like, thereby attempting to dial a call.

Most generally, the user touches a touch screen with his/her fingertips and moves his/her fingers on the touch screen to move a cursor displayed in a graphical environment. In addition, the user can operate the stylus in connection with the touch screen by pressing a stylus tip on the touch screen and moving the stylus.

Background Art of the present invention is disclosed in the Korean Laid-Open Patent 10-2009-0020037 (Feb. 26, 2009) entitled "an apparatus and a method for controlling vibrations of a portable terminal".

As described above, various effects can be provided to a user by providing not only an output of a speaker but also a haptic sensation, when a touch is made through a touch screen or various events in a game are generated.

In recent years, as the size and weight of the portable terminals are reduced, it is difficult to transfer more realistic feeling only by a vibration motor embedded in the portable terminal.

Further, the terminal that does not provide the haptic sensation according to various events cannot be provided with various effects.

SUMMARY

An embodiment of the present invention relates to a haptic feedback case for electronic equipment interworking with electronic equipment to provide haptic sensation through a haptic generator including a film type actuator in the case for electronic equipment.

Another embodiment of the present invention relates to a haptic feedback case for electronic equipment including: a main body configured to accommodate the electronic equipment; a communication unit configured to receive haptic generation information from the electronic equipment; a film type actuator configured to generate haptic sensations; and a control unit configured to operate the film type actuator according to the haptic generation information input from the communication unit.

The main body may further include a connector that is connected to the electric equipment to receive power and the haptic generation information.

The main body may further include the connector that is connected to the electronic equipment to receive power.

The communication unit may receive haptic generation information from the electronic equipment by short range wireless communication.

The haptic feedback case for electronic equipment may further include a power supply device configured to supply the power through the connector to the control unit.

The power supply device may be a battery.

The haptic generation information may include a click event, a menu event, a next-page event, a lock-page event, a text-highlight event, a music event, and a GUI (Graphic User Interface) operation event in the electronic equipment.

The film type actuator may include: a fixing member attached to a bottom surface of the main body; a film type flexible part attached to the fixing member and having the length expanded and contracted according to an operating signal of the control unit; and a haptic generation member contacting the film type flexible part to output a movement of the film type flexible part as haptic sensations.

One side of the haptic generation member may be further provided with a haptic augmented member.

The fixing member may be an elastic material.

The elastic material may be conductive.

The film type flexible part may be made of electro active polymer, electro active cellulose, and shape memory alloy.

The film type flexible part may be arranged in plurality so as to be parallel with each other.

The film type flexible part and the haptic generation member may partially contact each other.

The communication unit, the film type actuator, and the control unit may be buried in the bottom surface of the main body.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Figure 1:
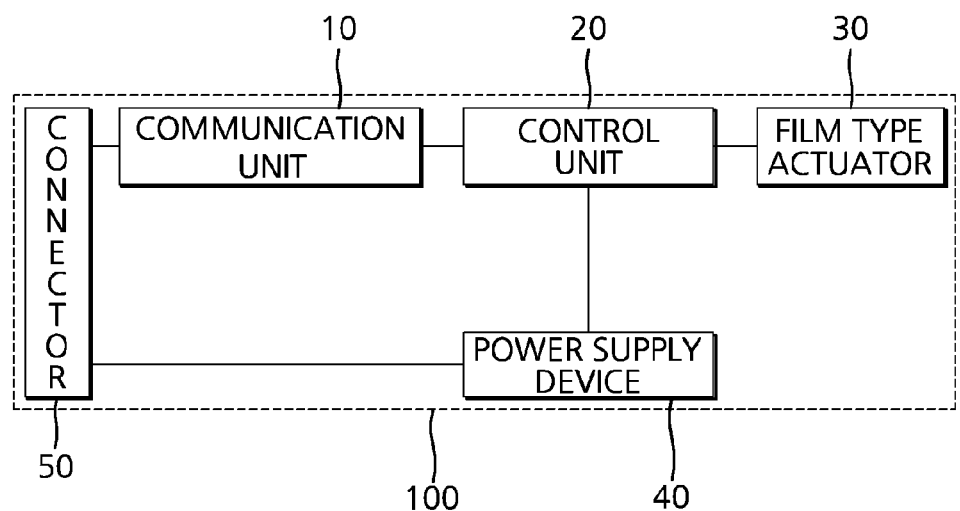
FIG. 1 is a block configuration diagram illustrating a haptic feedback case for electronic equipment in accordance with an embodiment of the present invention.

A haptic feedback case for electronic equipment in accordance with exemplary embodiments of the present invention will be described with reference to the accompanying drawings. In describing the embodiment, a thickness of lines illustrated in the drawings, a size of components, etc., may be exaggeratedly illustrated for clearness and convenience of explanation. In addition, terms described to be below are terms defined in consideration of functions in the present invention, which may be changed according to the intention or practice of a user or an operator. Therefore, these terms will be defined based on contents throughout the specification.

Hereinafter, embodiments of the present invention will be described with reference to accompanying drawings. However, the embodiments are for illustrative purposes only and are not intended to limit the scope of the invention.

Figure 2:
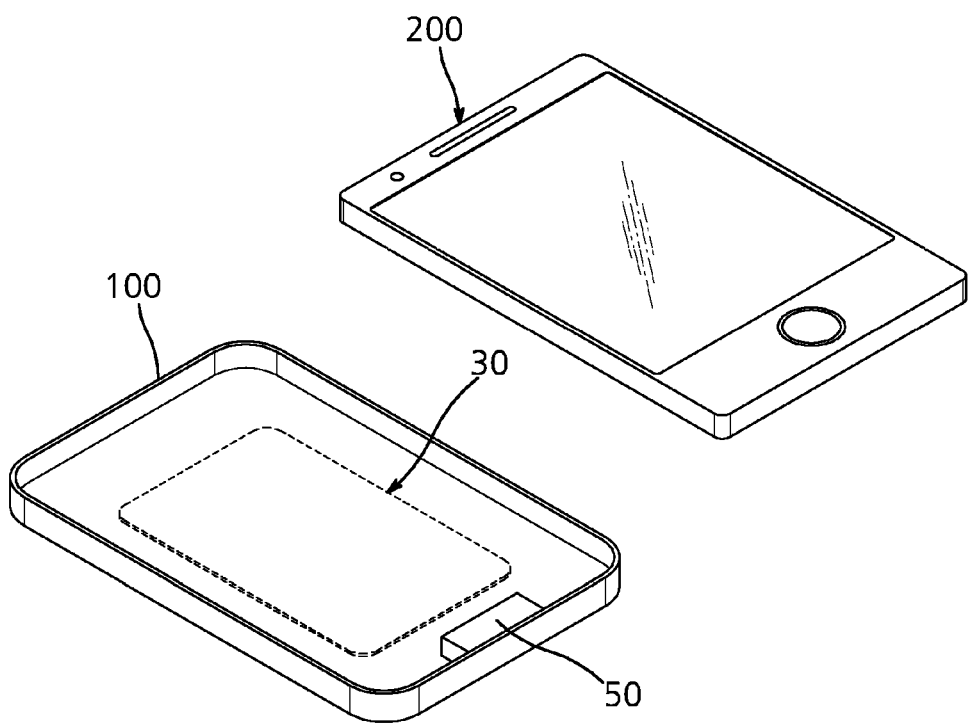
FIG. 2 is a diagram for describing a use state of the haptic feedback case for electronic equipment in accordance with the embodiment of the present invention.
Figure 3:
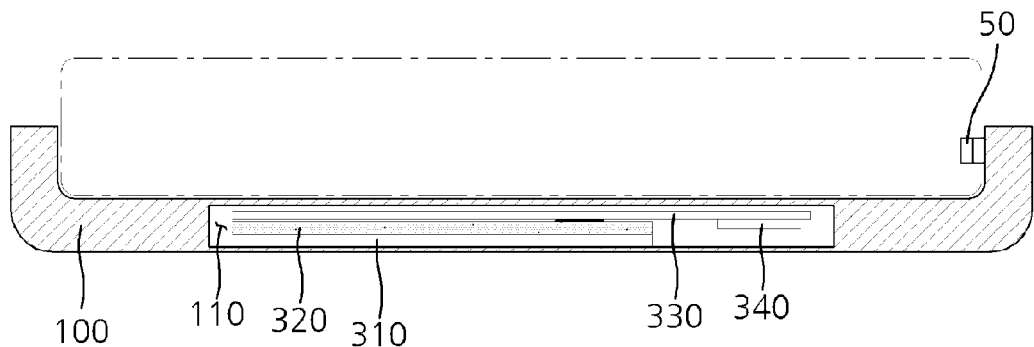
FIG. 3 is a cross-sectional view of the haptic feedback case for electronic equipment in accordance with the embodiment of the present invention.

FIG. 1 is a block configuration diagram illustrating a haptic feedback case for electronic equipment in accordance with an embodiment of the present invention, FIG. 2 is a diagram for describing a use state of the haptic feedback case for electronic equipment in accordance with the embodiment of the present invention, and FIG. 3 is a cross-sectional view taken along line A-A' of the haptic feedback case for electronic equipment in accordance with the embodiment of the present invention.

As illustrated in FIGS. 1 and 2, the haptic feedback case for electronic equipment in accordance with the embodiment of the present invention includes a main body 100, a communication unit 10, a film type actuator 30, and a control unit 20, and a connector 50.

The main body 100 is configured to receive electronic equipment 200, that is, a mobile phone. Therefore, the main body 100 is configured to protect the electronic equipment 200 from external impact without problems while the electronic equipment 200 used in the state in which the electronic equipment is inserted into the main body 100.

The communication unit 10 receives haptic generation information from the electronic equipment 200.

In this case, the communication unit 10 may also be connected with the electronic equipment 200 in a wired manner to receive the haptic generation information. Further, the communication unit 10 may also receive the haptic generation information through short distance radio communication such as Bluetooth, WiFi, or the like.

The haptic generation information that includes event signals, such as a click event, a menu event, a next-page event, a lock-page event, a text-highlight event, a music event, a GUI (Graphic User Interface) operation event, or the like, generating various effects in the electronic equipment 200, is provided to a user through haptic sensation.

The film type actuator 30 generates vibrations, such that the user of the electronic equipment 200 can feel the haptic sensation through haptic sensations.

The control unit 20 operates the film type actuator 30 according to the haptic generation information input from the communication unit 10.

Further, in the embodiment of the present invention, when the main body 100 includes the connector 50 to allow the communication unit 10 to support wired communication, the main body 100 receives power from the electronic equipment 200 through the connector 50 and receives the haptic generation information.

However, when the communication unit 10 supports wireless communication, the main body 100 may receive power from only the electronic equipment through the connector 50.

Further, the embodiment of the present invention can include a power supply device 40 to charge power supplied from the electronic equipment 200 and supply power to the control unit 20, such that the main body 100 receives the haptic generation information to generate haptic sensations even though the main body 100 is not connected to the electronic equipment 200 through the connector when the communication unit 10 supports the wireless communication. Here, the power supply device 40 may be a battery.

Describing in more detail the configuration of the film type actuator 30 in accordance with the embodiment of the present invention, the film type actuator 30 may be extensively formed on the bottom portion of the main body 100 as illustrated in FIG. 3.

FIG. 3 is a cross-sectional view of line A-A' of FIG. 2, wherein the film-type actuator 30 is formed in a buried hole 110 on the bottom portion of the main body 100.

In the embodiment of the present invention, the film-type actuator 30, the communication unit 10, the control 20, and the power supply device 40 may also be formed in the buried hole 100 on the main body 100.

That is, when a part thickness of the film type actuator 30, the communication unit 10, the power supply device 40, and the control unit 20 may be set to be 0.3 to 0.5 mm, the thickness of the main body 100 may be maintained at about 1.5 to 2.5 mm, such that the case in accordance with the embodiment of the present invention may be formed very thinly.

As illustrated in FIG. 3, the film type actuator 30 includes a fixing member 310, a film type flexible part 320, and a haptic generation member 330.

The fixing member 310 is fixedly attached to the bottom surface of the main body 100 and may be made of an elastic material, such as rubber, or the like, so as to be freely moved at the time of expanding film type flexible unit 320.

Further, the elastic material, which is a conductive material having elasticity, may apply the operating signal of the controller 20 to the film type flexible part 320.

The film type flexible part 320 is attached to the fixing member 310 and may be made of electro active polymer, electro active cellulose, and shape memory alloy, or the like, of which the length may be increased or reduced when being applied with an electrical signal by the operating signal of the control unit 20. However, when the electrical signal is applied, any material of which the length may be instantly increased or reduced may be used.

In this case, the plurality of film type flexible parts 320 may also be arranged in parallel so as to increase the output of the motion.

The haptic generation member 330 contacts the film type flexible unit 320 to output the motion at the film type flexible part 320 as the haptic sensations.

In this case, the film type flexible part 320 and the haptic generation member 330 partially contact each other, such that the haptic generation member 330 may move left and right when the film type flexible part 320 is expanded and contracted.

For example, in the case in which the haptic generation member 330 contacts the right of the film type flexible part 320, the film type flexible part 320 may move left when the film type flexible part 320 is contracted and may move right when the film type flexible part 320 is expanded. When the film type flexible part 320 is controlled to be repeatedly expanded and contracted quickly, the haptic generation member 330 may provide sensations such as vibrations by moving left and right quickly. On the other hand, when the film type flexible part 320 is controlled to be contracted quickly and stopped, the haptic generation member 330 may provide sensations like impacted to the left quickly.

In addition, one side of the haptic generation member 330 is further provided with a haptic augmented member 340, which results in augmenting a change in inertia to the movement of the haptic generation member 340 to generate stronger haptic sensations, thereby strongly transferring the haptic generation information.

In this case, when the battery is provided, the battery may be used as the haptic augmented member 340.

Figure 4:
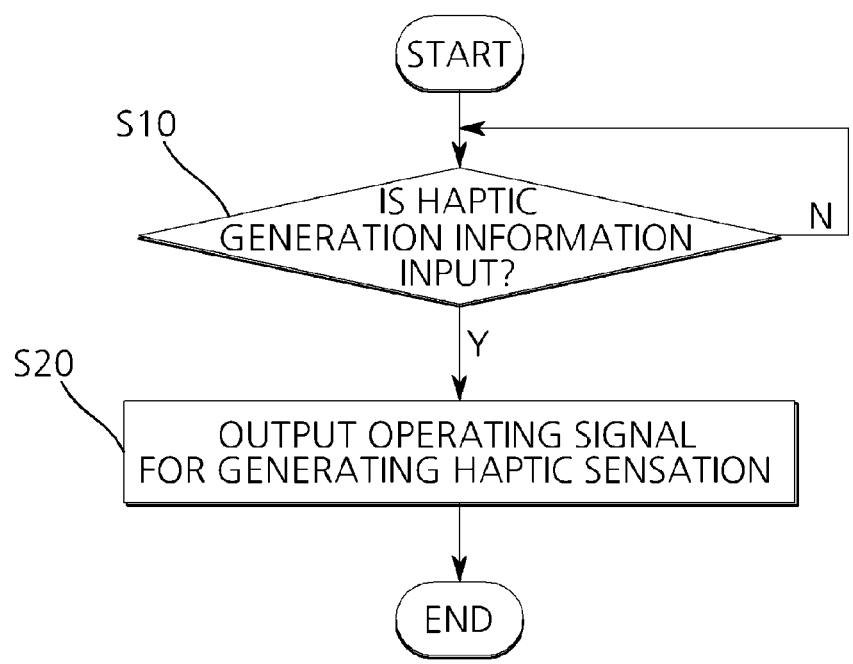
FIG. 4 is a flow chart for describing an operating state of the haptic feedback case for electronic equipment in accordance with the embodiment of the present invention.

FIG. 4 is a flow chart for describing an operating state of the haptic feedback case for electronic equipment in accordance with the embodiment of the present invention.

As illustrated in FIG. 4, the control unit 20 of the haptic feedback case for electronic equipment receives the haptic generation information output from the electronic equipment through the communication unit 10 when being supplied with power from the electronic equipment 200 through the connector 50 in the state in which the electronic equipment 200 is accommodated in the main body 100 as illustrated in FIG. 2 (S10).

The haptic generation information includes the event signals such as the click event, the menu event, the next-page event, the lock-page event, the text highlight event, the music event, the GUI (Graphic User Interface) operation event, or the like, that generate various effects to the user through the haptic sensation, wherein the event signals allow the user to feel reality like actually operating buttons or menus in addition to visual information, when operating various types of user interfaces on the touch screen using the input devices such as the touch screen of devices including computing functions such as a mobile phone, a smart phone, tablet, or the like, that are the electronic equipment 200.

As described above, when the control unit 20 receives the haptic generation information, the film type actuator 30 outputs the operating signal to generate haptic sensations, such that the user can feel the haptic sensation (S20).

In this case, as the film type actuator 30 moves left and right while the film type flexible part 320 is instantly expanded and contracted when the electrical signal that is the operating signal is input from the control unit 20, the haptic sensation is generated through the haptic generation member 330 and the generated haptic sensation is further increased by the haptic augmented member 340, such that the user using the electronic equipment 200 can feel the haptic sensation.

The exemplary embodiments of the present invention can provide the thin case protecting the electronic equipment without degrading the usability and various haptic effects even in the electronic equipment without haptic output and improve the operational sensitivity of the electronic equipment by providing the haptic feedback case for electronic equipment interworking with electronic equipment to provide the haptic sensation through the haptic generator including the film type actuator in the case for electronic equipment.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A haptic feedback case for electronic equipment, comprising:
    a main body configured to accommodate the electronic equipment;
    a communication unit configured to receive haptic generation information from the electronic equipment;
    a film type actuator configured to generate haptic sensations; and
    a control unit configured to operate the film type actuator according to the haptic generation information input from the communication unit,
    wherein the film type actuator includes a fixing member attached to a bottom surface of the main body, a film type flexible part attached to the fixing member and having the length expanded and contracted according to an operating signal of the control unit and a haptic generation member contacting the film type flexible part to output a movement of the film type flexible part as haptic sensations, and
    wherein one side of the haptic generation member is further provided with a haptic augmented member.

2. The haptic feedback case for electronic equipment of claim 1, wherein the main body further includes a connector that is connected to the electric equipment to receive power and the haptic generation information.

3. The haptic feedback case for electronic equipment of claim 1, wherein the main body further includes the connector that is connected to the electronic equipment to receive power.

4. The haptic feedback case for electronic equipment of claim 3, wherein the communication unit receives the haptic generation information from the electronic equipment by short range wireless communication.

5. The haptic feedback case for electronic equipment of claim 3, further comprising a power supply device configured to supply the power through the connector to the control unit.

6. The haptic feedback case for electronic equipment of claim 5, wherein the power supply device is a battery.

7. The haptic feedback case for electronic equipment of claim 1, wherein the haptic generation information includes at least one of a click event, a menu event, a next-page event, a lock-page event, a text-highlight event, a music event, and a GUI (Graphic User Interface) operation event in the electronic equipment.

8. The haptic feedback case for electronic equipment of claim 1, wherein the fixing member is an elastic material.

9. The haptic feedback case for electronic equipment of claim 8, wherein the elastic material is conductive.

10. The haptic feedback case for electronic equipment of claim 1, wherein the film type flexible part comprises electro active polymer, electro active cellulose, and shape memory alloy.

11. The haptic feedback case for electronic equipment of claim 1, wherein the film type flexible part is arranged in plurality so as to be parallel with each other.

12. The haptic feedback case for electronic equipment of claim 1, wherein the film type flexible part and the haptic generation member partially contact each other.

13. The haptic feedback case for electronic equipment of claim 1, wherein the communication unit, the film type actuator, and the control unit are buried in the bottom surface of the main body.

* * * * *